United States Patent [19]

Taguchi et al.

[11] Patent Number: 4,791,616

[45] Date of Patent: Dec. 13, 1988

[54] SEMICONDUCTOR MEMORY DEVICE

[75] Inventors: Masao Taguchi, Sagamihara; Yoshihiro Takemae, Tokyo, both of Japan

[73] Assignee: Fujitsu Limited, Kanagawa, Japan

[21] Appl. No.: 879,782

[22] Filed: Jun. 27, 1986

[30] Foreign Application Priority Data

Jul. 10, 1985 [JP] Japan .................................. 60-150097
Feb. 4, 1986 [JP] Japan .................................. 61-021294

[51] Int. Cl.$^4$ .............................................. G11C 11/40
[52] U.S. Cl. .................................... 365/205; 365/208; 365/203
[58] Field of Search ................ 365/189, 190, 203, 205, 365/208, 207, 210; 307/355

[56] References Cited

U.S. PATENT DOCUMENTS 4,255,679  3/1981  White, Jr. et al. ............. 365/203 X
4,287,576  9/1981  Pricer .................................. 365/203
4,441,171  4/1984  Hoffmann ......................... 365/205

Primary Examiner—Joseph A. Popek
Attorney, Agent, or Firm—Armstrong, Nikaido, Marmelstein & Kubovcik

[57] ABSTRACT

A semiconductor memory device comprises a memory cell array constituted by a plurality of pairs of memory groups. Two memory gruops of each pair of memory groups have sense amplifiers respectively driven with mutually opposite phases, so as to cancel noise in the bit lines and stabilize the potential of the cell plate.

10 Claims, 11 Drawing Sheets

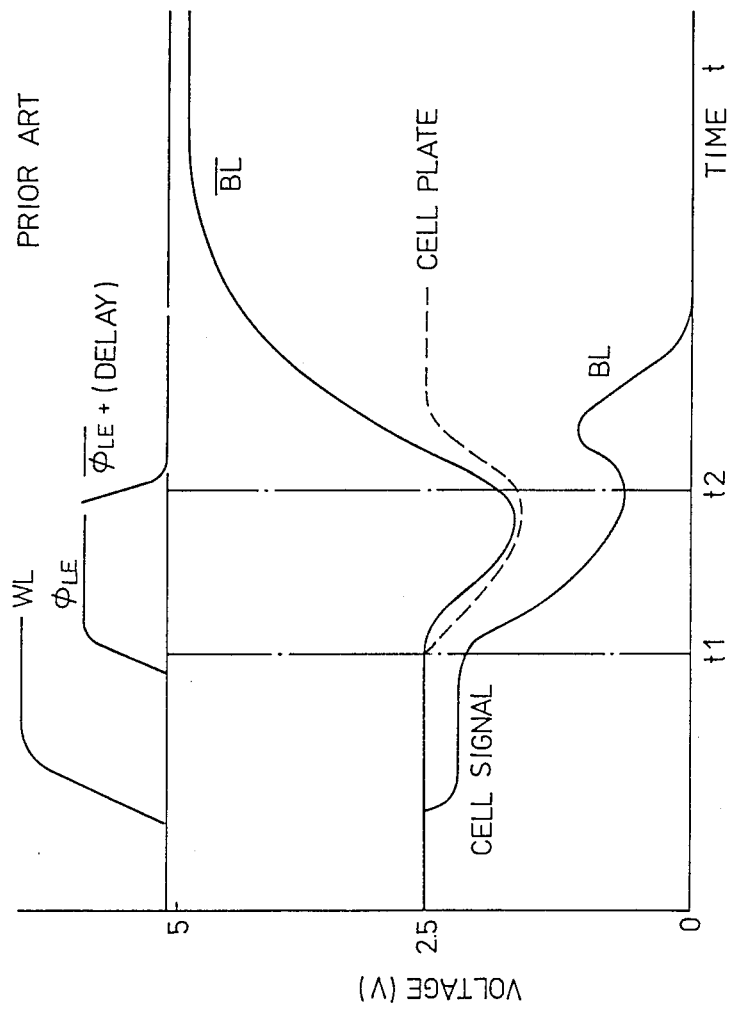

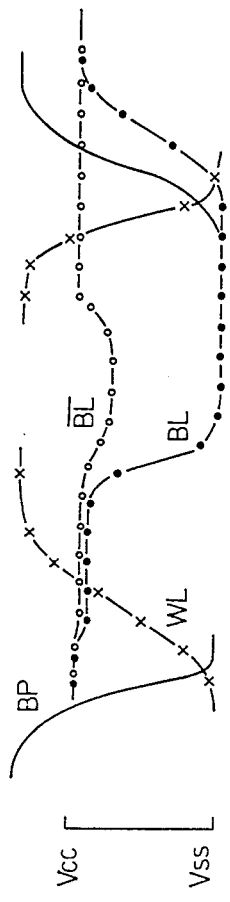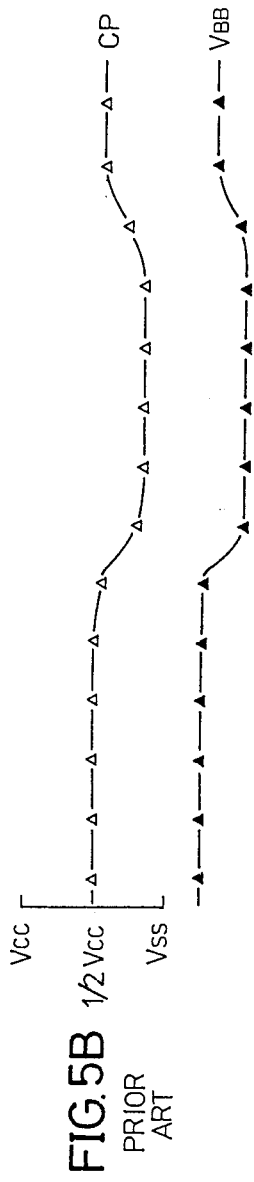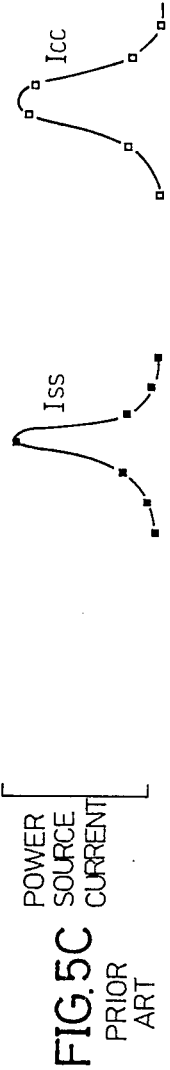
FIG.5A PRIOR ART
FIG.5B PRIOR ART
FIG.5C PRIOR ART

SEMICONDUCTOR MEMORY DEVICE

FIELD OF THE INVENTION

The present invention generally relates to semiconductor memory devices, and more particularly to a semiconductor memory device which comprises a memory cell array constituted by a plurality of pairs of memory groups, wherein two memory groups of each pair of memory groups have sense amplifiers respectively driven with mutually opposite phases.

BACKGROUND OF THE INVENTION

Conventionally, peripheral circuits of a dynamic random access memory (DRAM) comprising one-transistor one-capacitor type memory cells are constituted by N-channel metal oxide semiconductor (MOS) transistors in most cases. However, due to the recent improvement in the integration density of the DRAM, there is a tendency to use complementary metal oxide semiconductor (CMOS) transistors in the peripheral circuits of the DRAM. One reason the CMOS transistors are used in the peripheral circuits of the DRAM is that the construction of the peripheral circuits becomes simple. In other words, when pre-charging a circuit which performs a dynamic operation, it is possible to pre-charge the circuit at a sufficiently high speed to a power source voltage by use of P-channel transistors constituting the CMOS transistors. Accordingly, unlike in the conventional case, it is unnecessary to use a clock signal having a level which is raised to a level over the power source voltage by means of a bootstrap circuit or the like.

As a result, the voltages used within the circuit are in the range of the power source voltage, and an abnormally high voltage will not be applied to the transistors. For this reason, it is possible to reduce the undesirable effects of hot electrons. In addition, th circuit construction is simple because it is unnecessary to provide the bootstrap circuit or the like.

Recently, sense amplifiers are also constituted by CMOS transistors because the peripheral circuits of the DRAM are constituted by the CMOS transistors in order to take advantage of the advantageous features described before. As a result, although a conventional active restore circuit occupies a large area due to the complex circuit construction thereof, it becomes possible to realize the active restore circuit by use of simple latch circuits in the form of flip-flops. It becomes possible to construct the active restore circuit by use of only two transistors. According to the sense amplifier constituted by the CMOS transistors, a pair of bit lines are pre-charged to a high level, and the potential at one of the bit lines always falls due to the sense operation of the sense amplifier.

As will be described later on in the present specification in conjunction with the drawings, first and second bit lines are initially pre-charged to a predetermined voltage. When the potential at a word line rises, cell voltages are obtained at the first and second bit lines. The potential of the first bit line falls at a first line t1 when the sense amplifier operates. At the same time, the potential at the second bit line also falls slightly. Then, when the active restore circuit operates at a second time t2, the potential at the first bit line rises slightly due to noise and thereafter falls, while the potential at the second bit line rises up to the power source voltage. However, the bit line and a cell plate of the memory cell are coupled via a parasitic capacity. Conventionally, the potential of the cell plate is set to the ground level in most cases and the potential of the cell plate is relatively stable. But a bias at one-half the power source voltage is recently employed so as to relieve the absolute value of the electrical field in the memory capacitor, and in such a case, the potential of the cell plate becomes quite unstable. The reason why the bias at one-half the power source voltage is employed is because the memory capacitor uses a silicon dioxide ($SiO_2$) film having a film thickness in the order of 100 to 200 (Å) as the dielectric film and a dielectric breakdown will occur when a high voltage is applied thereto.

Usually, the voltage of one-half the power source voltage is obtained by use of a pair of voltage dividing resistors having high resistances. The voltage dividing resistors have the high resistances in order to prevent an unnecessary current flow which causes unnecessary power consumption. Since the impedance of the cell plate is extremely high with respect to the power source, the potential of the cell plate fluctuates when the potential at the bit line falls, due to the capacitive coupling between the bit line and the cell plate.

Accordingly, when the potential at the bit line falls between the first and second times t1 and t2, the potential of the cell plate which is coupled to the bit line via the parasitic capacity fluctuates locally and instantaneously. This fluctuation in the potential of the cell plate generates the so-called bump noise and causes erroneous read-out of a datum from the memory cell. In other words, when the bump noise occurs, the read-out voltage decreases in correspondence with a difference between the potentials of the cell plate at the time of the write-in and at the time of the read-out. In extreme cases, the datum may be sensed as a datum opposite to the actual datum. In addition, in the case where the memory cell array is positioned in a well of a CMOS structure and the potential of the cell plate fluctuates as described above, the potential of the well which forms a capacitive coupling with the cell plate undergoes a transitional change. As a result, the P-N junction within the well may become partially forward biased and cause latchup.

On the other hand, when the potential at the bit line changes from a high level to a low level or vice versa, a large current flows to a power source voltage supplying line or a ground line, and this large current generates noise in the bit line. As a result, there is a problem in that the semiconductor memory device may perform an erroneous operation due to such noise in the bit line.

SUMMARY OF THE INVENTION

Accordingly, it is a general object of the present invention to provide a novel and useful semiconductor memory device in which the problems described heretofore and eliminated.

Another and more specific object of the present invention is to provide a semiconductor memory device which comprises a memory cell array constituted by a plurality of pairs of memory groups, wherein two memory groups of each pair of memory groups have sense amplifiers respectively driven with mutually opposite phases. According to the semiconductor memory device of the present invention, it is possible to effectively cancel noise in the bit lines and stablize the potential of the cell plate, so that the sensitivity of the sense amplifier is improved. In addition, it is possible to prevent a large current from flowing to a power source voltage supplying line or a ground line when the potential at the bit line changes from a high level to a low level or vice versa, and accordingly prevent noise from being generated in the bit line thereby. Hence, the reliability of the semiconductor memory device is considerably improved.

Still another object of the present invention is to provide a semiconductor memory device comprising a plurality of bit line pairs which are pre-charged to a potential which is inbetween a high level and a low level, a first dynamic flip-flop circuit which comprises P-channel transistors and senses and amplifies a potential difference between each bit line pair introduced by an output of a corresponding memory cell for a first half of all of the bit line pairs, a second dynamic flip-flop circuit which comprises N-channel transistors and senses and amplifies a potential difference between each bit line pair introduced by an output of a corresponding memory cell for a remaining second half of all of the bit line pairs substantially at the same time as the sensing and amplification performed by the first dynamic flip-flop circuit, a third dynamic flip-flop circuit which comprises N-channel transistors and restores the potentials at each bit line pair for the first half of all of the bit line pairs, and a fourth dynamic flip-flop circuit which comprises P-channel transistors and restores the potentials at each bit line pair for the remaining second half of all of the bit line pairs. According to the semiconductor memory device of the present invention, it is possible to stabilize the cell plate voltage by cancelling noise in the bit line pairs when the first and second dynamic flip-flop circuits perform the sensing and amplification. Hence, it is possible to suppress the generation of the so-called bump noise, and the sensitivity of the sense amplifier is improved.

A further object of the present invention is to provide a semiconductor memory device in which the widths of the gates of the P-channel transistors constituting the first dynamic flip-flop circuit are greater than the widths of the gates of the N-channel transistors constituting the second dynamic flip-flop circuit. According to the semiconductor memory device of the present invention, it is possible to obtain a more perfect noise cancelling effect because the first and second dynamic flip-flops circuits operate with symmetrical potential changes.

Another object of the present invention is to provide a semiconductor memory device comprising a memory cell array which is divided into two memory groups, a first sense amplifier which comprises P-channel transistors and is provided in a first memory group of the two memory groups, a second sense amplifier which comprises N-channel transistors and is provided in a second memory group of the two memory groups, a first bit line pair which is pre-charged to a power source voltage level and is provided in the first memory group, and a second bit line pair which is pre-charged to a ground voltage level and is provided in the second memory group. According to the semiconductor memory device of the present invention, the first and second memory groups operate with mutually opposite phases, and for this reason, it is possible to considerably reduce fluctuations in the cell plate voltage and the sbustrate bias voltage. As a result, noise in the bit lines is effectively reduced. Furthermore, it is possible to prevent a large current from flowing to the power source voltage supplying line and the ground line when the potential at the bit lines change during the read-out operation, and the reliability of the device is improved.

Other objects and further features of the present invention will be apparent from the following detailed description when read in conjunction with the accompanying drawings.

BRIEF DESCRIPTION OF THE DRAWINGS

FIG. 3 is a timing chart for explaining the operation of the device shown in FIG. 2;

FIGS. 5A, 5B and 5C are timing charts for explaining the operation of the device shown in FIG. 4;

DETAILED DESCRIPTION

Figure 1:
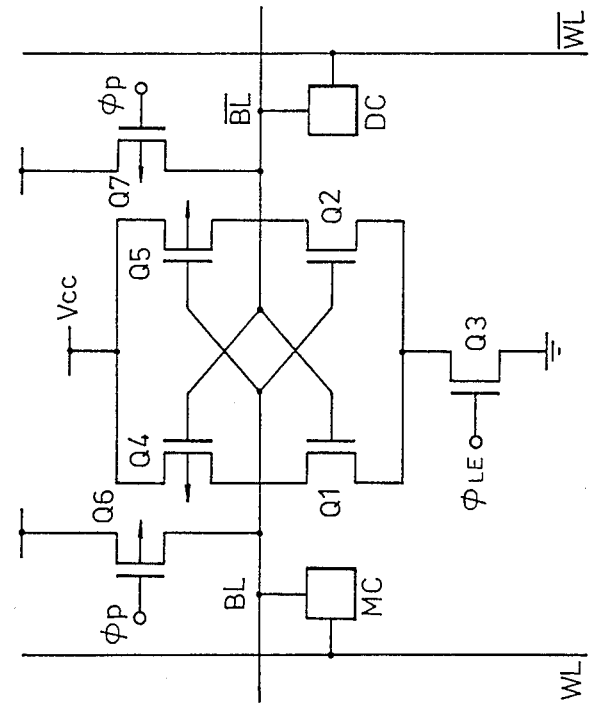
FIG. 1 is a circuit diagram showing an essential part of an example of the conventional semiconductor memory device employing a bit line pre-charge voltage equal to a power source voltage.

FIG. 1 shows the essential part of an example of the conventional semiconductor memory device which employs a bit line pre-charge voltage equal to the power source voltage. In FIG. 1, N-channel transistors Q1 and Q2 constitute a sense and latch circuit, and an N-channel transistor Q3 is used to turn the sense and latch circuit ON. P-channel transistors Q4 and Q5 constitute an active restore circuit, and P-channel transistors Q6 and Q7 are used to pre-charge bit lines BL and $\overline{BL}$. A memory cell MC and a dummy cell DC are coupled to the respective bit lines BL and $\overline{BL}$ and to respective word lines WL and $\overline{WL}$ as shown. In FIG. 1, Vcc denotes a power source voltage level, $\phi_P$ denotes a pre-charge clock signal and $\phi_{LE}$ denotes a restore clock signal.

When the clock signal $\phi_P$ is applied to the transistors Q6 and Q7, the transistors Q6 and Q7 are turned ON and the bit lines BL and $\overline{BL}$ are pre-charged to the power source voltage level Vcc. When the word lines WL and $\overline{WL}$ are selected, cell voltages read out from the memory cell MC and the dummy cell DC are applied to the respective bit lines BL and $\overline{BL}$. The cell voltage is determined by a ratio of the capacitance of the memory cell (or dummy cell) and the capacitance of the bit line, and the cell voltage read out from the memory cell MC is usually in the order of 200 (mV). Hence, in the case where a datum "0" is read out from the memory cell MC, the potential at the bit line BL falls from the power source voltage level Vcc by approximately 200 (mV) and the potential at the bit line $\overline{BL}$ falls by approximately 100 (mV) because the charge in the dummy cell DC is one-half that in the memory cell MC.

Since the transistors Q4 and Q5 have a threshold voltage of approximately −1 (V), these transistors Q4 and Q5 are OFF at the time when the cell voltages are applied to the bit lines BL and $\overline{BL}$. When the clock signal $\phi_{LE}$ is applied to the transistor Q3 and the transistor Q3 is turned ON, the transistors Q1 and Q2 are turned ON and the potential at one of the bit lines BL and $\overline{BL}$ having the lower potential falls quicker than that at the other bit line to thereby amplify the output of the memory cell MC. Hence, in the case where the memory cell MC contains the datum "0", the potential at the bit line BL becomes low and falls to the ground voltage level due to the ON state of the transistor Q1. At the same time, the gate of the transistor Q5 is biased to a low potential and the transistor Q5 is turned ON. Hence, the transistor Q5 performs the restore operation so as to restore the potential at the bit line $\overline{BL}$ up to the power source voltage level Vcc. On the other hand, the transistor Q4 is cut off because the potential at the bit line $\overline{BL}$ rises to the power source voltage level Vcc. Therefore, the transistors Q4 and Q5 perform the restore operation without the use of a special clock signal exclusively for the active restore operation.

However, according to the device shown in FIG. 1, the bit lines BL and $\overline{BL}$ must be pre-charged to the power source voltage level Vcc, and it is impossible to operate the device by pre-charging the bit lines BL and $\overline{BL}$ only to one-half the power source voltage level Vcc, that is, Vcc/2. If the sense and latch circuit constituted by the transistors Q1 and Q2 were operated and the bit lines BL and $\overline{BL}$ were pre-charged to the voltage level Vcc/2, the gate voltages of the transistors Q4 and Q5 would become equal to the voltage level Vcc/2 and these transistors Q4 and Q5 would become turned ON. In addition, when the sense and latch circuit is operated, the active restore circuit and the sense and latch circuit would both become turned ON instantaneously, and an unnecessary current would flow from a power source voltage supplying line to the ground line.

Figure 2:
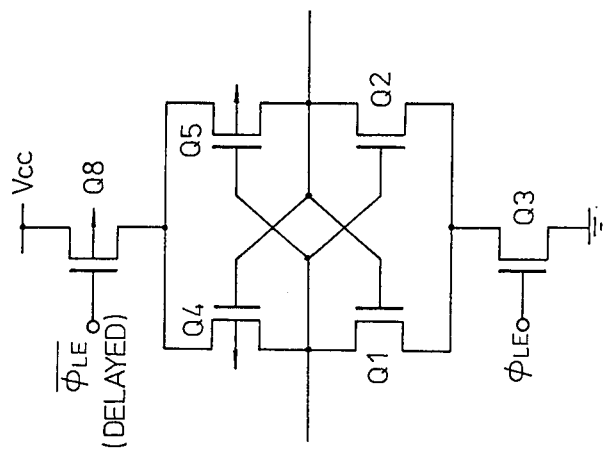
FIG. 2 is a circuit diagram showing an essential part of an example of the conventional semiconductor memory device employing a bit line pre-charge voltage equal to one half the power source voltage.

In order to eliminate the problems of the conventional device shown in FIG. 1 when the bit line pre-charge voltage Vcc/2 is employed, a device shown in FIG. 2 has been proposed. For convenience' sake, FIG. 2 shows only an essential part of the device in the vicinity of the sense and latch circuit. In FIG. 2, those parts which are the same as those corresponding parts in FIG. 1 are designated by the same reference numerals, and description thereof will be omitted.

In FIG. 2, a P-channel transistor Q8 is coupled between the power source voltage supplying line and the transistors Q4 and Q5 which constitute the active restore circuit. The transistor Q8 is turned ON when a delayed clock signal $\overline{\phi_{LE}}$ which is obtained by delaying the clock signal $\phi_{LE}$ by a predetermined delay time is applied to the gate thereof. The predetermined delay time is in the range of 10 to 20 (nsec). It is possible to eliminate the problems of the device shown in FIG. 1 by employing the arrangement shown in FIG. 2, even when the bit lines BL and $\overline{BL}$ are pre-charged only to the voltage level Vcc/2.

According to the sense amplifier constituted by the CMOS transistors, the bit lines BL and $\overline{BL}$ are initially pre-charged to a high level, and the potential at one of the bit lines BL and $\overline{BL}$ always falls due to the sense operation of the sense amplifier. FIG. 3 is a time chart for explaining the operation of the device shown in FIG. 2. As may be seen from FIG. 3, the bit lines BL and $\overline{BL}$ are initially pre-charged to 2.5 (V) which is the voltage level Vcc/2. When the potential at the word line WL rises, cell voltages are obtained at the bit lines BL and $\overline{BL}$. The potential at the bit line BL falls at a first time t1 when the clock signal $\phi_{LE}$ is applied to the transistor Q3 and the sense and latch circuit operates. At the same time, the potential at the bit line $\overline{BL}$ also falls slightly. Then, when the active restore circuit operates at a second time t2 when the delayed clock signal $\overline{\phi_{LE}}$ is applied to the transistors Q8, the potential at the bit line BL rises slightly due to noise and thereafter falls, while the potential at the bit line $\overline{BL}$ rises up to 5 (V) which is the power source voltage level Vcc.

However, the bit lines and a cell plate of the memory cell are coupled via a parasitic capacity. Conventionally, the potential of the cell plate is set to the ground level in most cases and the potential of the cell plate is relatively stable. But a bias at the voltage level Vcc/2 is recently employed so as to relieve the absolute value of the electrical field in the memory capacitor, and in such a case, the potential of the cell plate becomes quite unstable.

Accordingly, when the potentials at the bit lines BL and $\overline{BL}$ fall between the first and second times t1 and t2, the potential of the cell plate which is coupled to the bit lines via the parasitic capacity fluctuates locally and instantaneously. This fluctuation in the potential of the cell plate generates the so-called bump noise and causes erroneous read-out of the datum from the memory cell. In other words, when the bump noise occurs, the read-out voltage decreases in correspondence with a difference between the potentials of the cell plate at the time of the write-in and at the time of the read-out. In extreme cases, the datum may be sensed as datum opposite to the actual datum. In addition, in the case where the memory cell array is positioned in a well of a CMOS structure and the potential of the cell plate fluctuates as described above, the potential of the well which forms a capacitive coupling with the cell plate undergoes a transitional change. As a result, the P-N junction within the well may become partially forward biased and cause latchup.

In such cases, it has been confirmed by actual measurements that the potential of the cell plate may drop to as low as 2 (V) from 2.5 (V) due to the effects of potential drop at the bit line.

Figure 4:
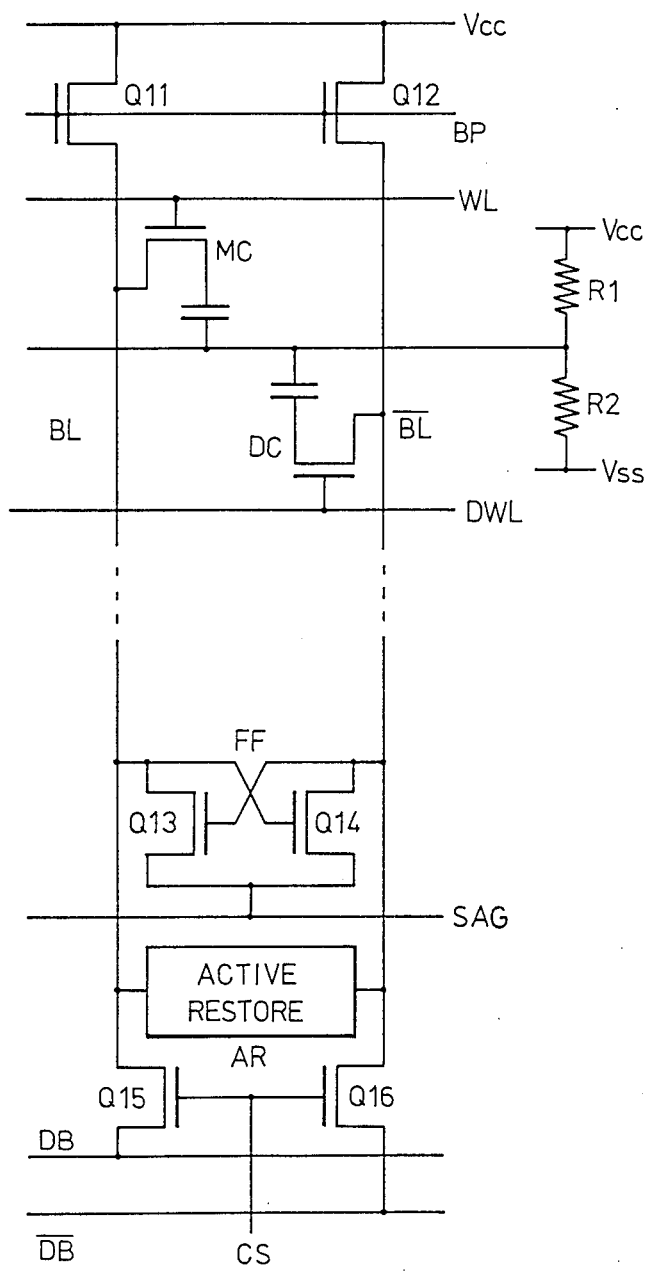
FIG. 4 is a circuit diagram showing an essential part of another example of the conventional semiconductor memory device employing the bit line pre-charge voltage equal to the power source voltage.

FIG. 4 shows the essential part of another example of the conventional semiconductor memory (DRAM) device which employs a bit line pre-charge voltage equal to the power source voltage. In FIG. 4, a memory cell MC constituted by a transfer gate transistor and a memory capacitor is coupled to a bit line BL and a word line WL. A dummy cell DC is coupled to a bit line $\overline{BL}$ and a dummy word line DWL. The bit lines BL and $\overline{BL}$ are folded bit lines. A signal line BP is a bit line pre-charge line for driving transistors Q11 and Q12. A sense amplifier FF is constituted by transistors Q13 and Q14 and has a ground line SAG for grounding. The sense amplifier FF and an active restore circuit AR are coupled to the bit lines BL and $\overline{BL}$. Gate transistors Q15 and Q16 are used to couple the bit lines BL and $\overline{BL}$ to respective data buses DB and $\overline{DB}$. In FIG. 4, Vcc denotes a power source voltage level, Vss denotes a ground voltage level, and CS denotes a column select signal from a column decoder (not shown). Resistors R1 and R2 have high resistances.

FIGS. 5A, 5B and 5C are time charts related to the voltage and current waveforms at essential parts of the device shown in FIG. 4, for explaining the operation of the device shown in FIG. 4. In FIGS. 5A, 5B and 5C, the same designation is used as in FIG. 4. In FIG. 5B, CP and $V_{BB}$ respectively denote a cell plate voltage and a substrate bias voltage. In FIG. 5C, Icc and Iss respectively denote a current flowing to a power source supplying line and a current flowing to a ground line.

Description will now be given with respect to the read-out operation of the device shown in FIG. 4. It will be assumed that a datum "0" is written in the memory cell MC. Initially, the potential at the signal line BP is a high level and the transistors Q11 and Q12 are ON. Accordingly, the bit lines BL and $\overline{BL}$ are charged up to the power source voltage level Vcc.

First, when the potential at the signal line BP falls to a low level, the bit lines BL and $\overline{BL}$ which are pre-charged to the power source voltage level Vcc assume floating states. Next, when the potential at the word line WL rises, a slight current flows from the bit line BL to the memory cell MC and the potential at the bit line BL falls slightly as shown in FIG. 5A. Consquently, a potential difference is introduced between the bit lines BL and $\overline{BL}$. This potential difference is sensed and amplified in the sense amplifier FF, and as a result, the potential at the bit line BL falls to the ground voltage level Vss and the potential at the bit line $\overline{BL}$ falls slightly due to the effects of the capacitive coupling or the like. The slight fall in the potential at the bit line $\overline{BL}$ is compensated for by the active restore circuit AR, and the potential at the bit line $\overline{BL}$ is again pulled up to the power source voltage level Vcc.

Such a sequence of operations completes one read-out operation, and thereafter, the potential at the word line WL is lowered and the bit lines BL and $\overline{BL}$ are again pre-charged to the power source voltage level Vcc. The transistors Q11 and Q12 are turned ON by raising the potential at the sigal lines BP, and the bit line BL which is at the low level is charged up to the power source voltage level Vcc.

As may be seen from FIG. 4, the memory cell MC comprises one transfer gate transistor and one memory capacitor, and one electrode of the memory capacitor is coupled to the transfer gate transistor while the other electrode of the memory capacitor is formed throughout the entire surface of the memory cell array and is called the cell plate. The bias at one half the power source voltage level Vcc, that is, Vcc/2, is recently employed so as to relieve the absolute value of the electrical field in the memory capacitor, as described before.

Usually, the voltage level Vcc/2 is obtained by use of the resistors R1 and R2 having the high resistances. The resistors R1 and R2 have the high resistances in order to prevent an unnecessary current from flowing from the power source voltage supplying line to the ground line. Since the impedance of the cell plate is extremely high with respect to the power source, the cell plate voltage CP fluctuates when the potential at the bit line BL falls from the power source voltage level Vcc to the ground voltage level Vss due to the capacitive coupling between the bit line and the cell plate, as shown in FIG. 5B. In addition, the impedance of a subustrate bias generator (not shown) is also high with respect to the power source, and the substrate bias voltage $V_{BB}$ also fluctuates as shown in FIG. 5B. Such fluctuations in the cell plate voltage CP and the substrate bias voltage $V_{BB}$ generate noise in the bit lines and cause the erroneous operation of the device.

In addition, when the potential at the bit line BB falls from the power source voltage level Vcc to the ground voltage level Vss during the read-out, a large current Iss shown in FIG. 5C flows to the ground line. Furthermore, when the potential at the bit line BL rises from the ground voltage level Vss to the power source voltage level Vcc, a large current Icc shown in FIG. 5C flows to the power source voltage supplying line. Noise is generated in the bit line when such large currents flow, and causes the erroneous operation of the device.

The present invention provides a semiconductor memory device which comprises a memory cell array constituted by a plurality of pairs of memory groups, wherein two memory groups of each pair of memory groups have sense amplifiers respectively driven with mutually opposite phases, so as to eliminate the problems of the conventional devices.

Figure 6:
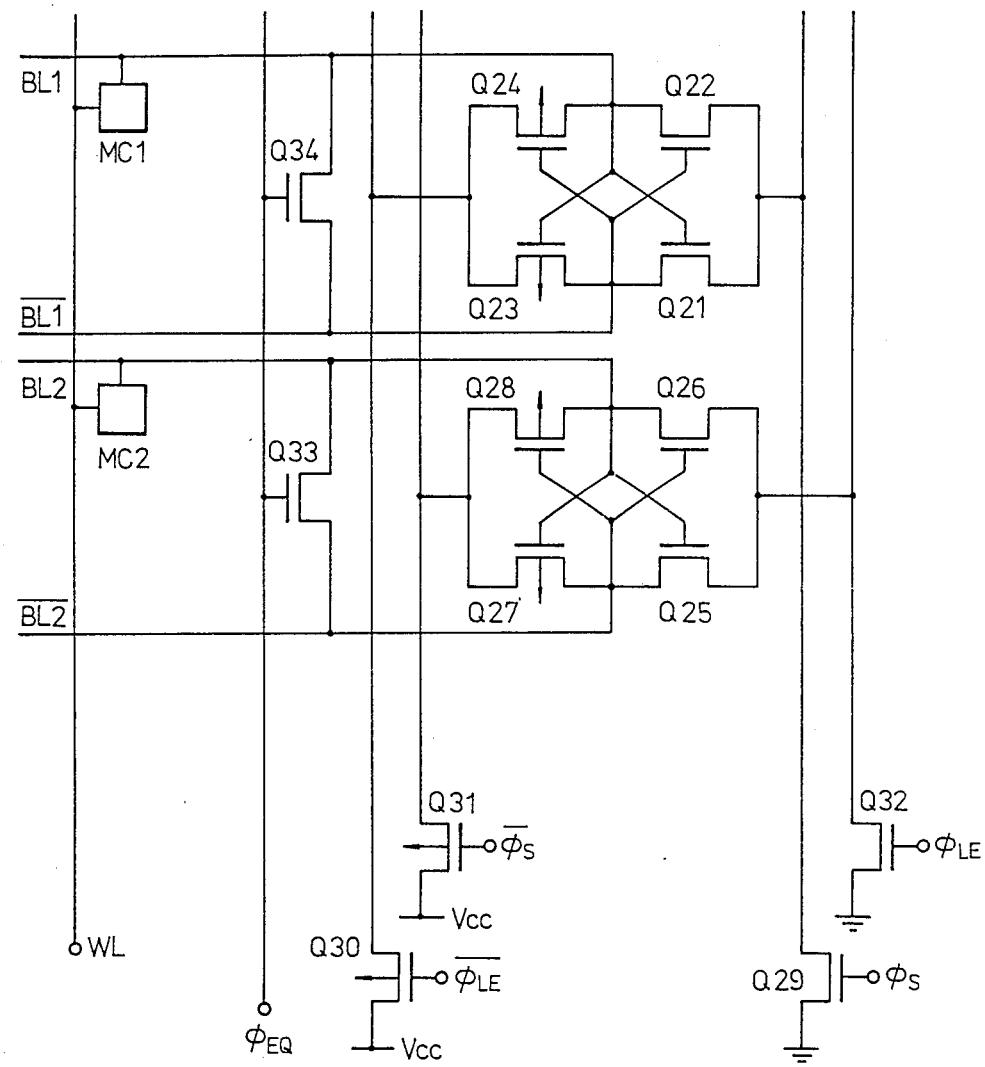
FIG. 6 is a circuit diagram showing an essential part of a first embodiment of the semiconductor memory device according to the present invention.

FIG. 6 shows the essential part of a first embodiment of the semiconductor memory device according to the present invention which employs a bit line pre-charge voltage equal to one-half the power source voltage. In FIG. 6, transistors Q21 through Q28 constitute a pair of sense amplifiers, and a transistor Q29 is used to turn a sense and latch circuit ON. Transistors Q30 and Q31 are used for supplying the power source voltage, and a transistor Q32 is used to turn active restore circuits ON. Transistors Q33 and Q34 constitute a bit line short-circuiting circuit. A memory cell MC1 is coupled to a bit line BL1 and a word line WL, and a memory cell MC2 is coupled to a bit line BL2 and the word line WL. In FIG. 6, $\phi_{LE}$ and $\overline{\phi_{LE}}$ denote restore clock signals, $\phi_S$ and $\overline{\phi_S}$ denote clock signals for driving the sense amplifiers, Vcc denotes the power source voltage level, and $\phi_{EQ}$ denotes an equalizing clock signal.

As shown in FIG. 6, a first one of the pair of sense amplifiers is constituted by the N-channel transistors Q21 and Q22 and the P-channel transistors Q23 and Q24, while a second one of the pair of sense amplifiers is constituted by the N-channel transistors Q25 and Q26 and the P-channel transistors Q27 and Q28. The first sense amplifier is coupled to the bit lines BL1 and $\overline{BL1}$, and the second sense amplifier is coupled to the bit lines BL2 and $\overline{BL2}$. With respect to the two pairs of bit lines, the same mask pattern is used for the first and second sense amplifiers. However, the first and second sense amplifiers are driven by signals having different timings so that the N-channel transistors Q21 and Q22 operate as the sense and latch circuit and the P-channel transistors Q23 and Q24 operate as the active restore circuit in the first sense amplifier, while the P-channel transistors Q27 and Q28 operate as the sense and latch circuit and the N-channel transistors Q25 and Q26 operate as the active restore circuit in the second sense amplifier.

According to the present embodiment, the sense and latch circuit and the active restore circuit of the sense amplifier cannot be driven simultaneously for the following reasons. That is, when the bit lines BL1, $\overline{BL1}$, BL2 and $\overline{BL2}$ are pre-charged to the voltage level Vcc/2 and both the P-channel transistors and the N- channel transistors of the sense amplifier are driven, both the P-channel and N-channel transistors become turned ON and an unnecessary current will flow from the power source to the ground. Such an unnecessary current flow will lead to an unnecessary power consumption. Accordingly, in the present embodiment, the N-channel transistors of the first sense amplifier are driven first so as to sense and amplify a minute potential difference between the bit lines and the P-channel transistors of the second sense amplifier are driven first so as to sense and amplify a minute potential difference between the bit lines, as may be seen from FIGS. 7A, 7B and 7C. It will be assumed that the memory cells MC1 and MC2 contain data "0".

Figure 7A:
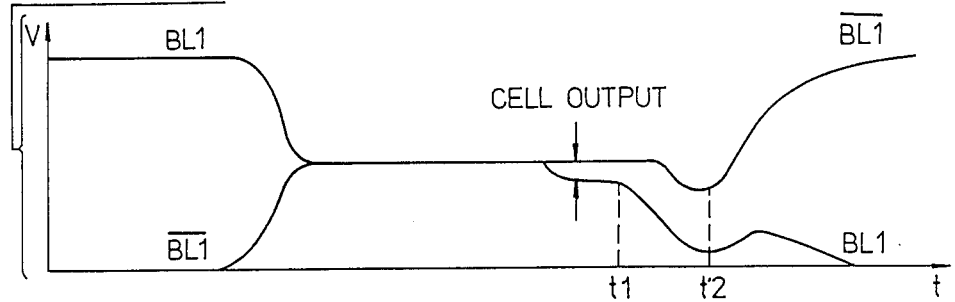
FIGS. 7A, 7B and 7C are time charts for explaining the operation of the device shown in FIG. 6.
Figure 7B:
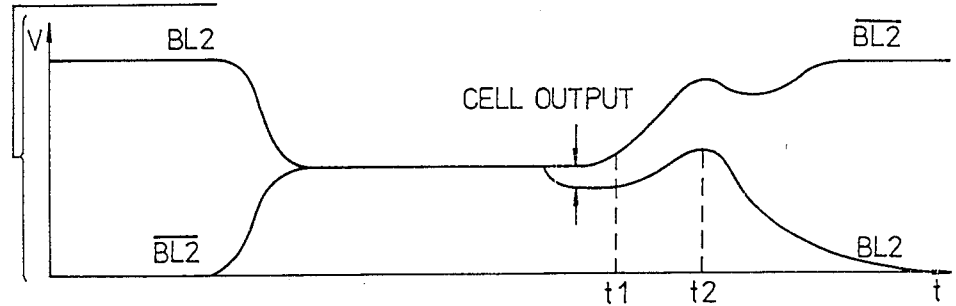
Figure 7C:
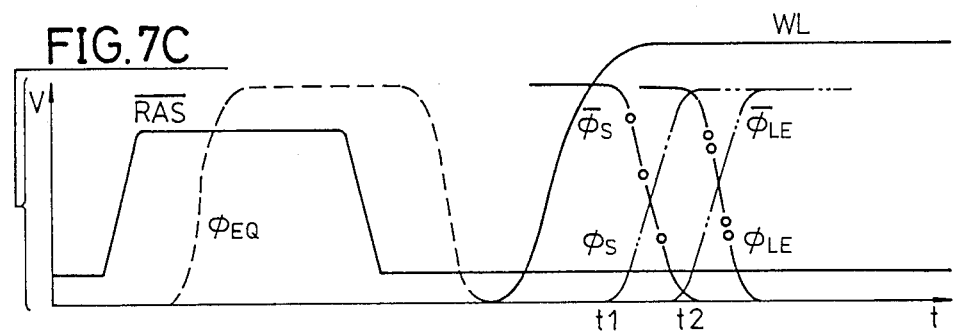

FIGS. 7A through 7C are timing charts related to the voltage waveforms at essential parts of the device shown in FIG. 6. In FIGS. 7A through 7C, the same designation is used as in FIG. 6, and the ordinate represents the voltage V and the abscissa represents the time t. In FIG. 7C, $\overline{RAS}$ denotes a low address strobe signal.

First, the bit lines BL1, $\overline{BL1}$, BL2 and $\overline{BL2}$ are at the respective high and low levels after the read-out operation is completed. The memory cell array is reset responsive to a rising edge of the low address strobe signal $\overline{RAS}$. When the equalizing clock signal $\phi_{EQ}$ is applied to the transistors Q23 and Q24, all of the bit lines BL1, $\overline{BL1}$, BL2 and $\overline{BL2}$ are pre-charged to the voltage level Vcc/2, and the device waits for the next read-out operation. When the word line WL of the address which is to be read is driven, the cell voltage from the memory cell is applied to the bit line and a minute potential difference is introduced between the pair of bit lines.

The first and second sense amplifiers are driven at a time t1. In other words, the clock signals $\phi_S$ and $\overline{\phi_S}$ respectively rise and fall or vice versa. The transistor Q29 is turned ON responsive to the rising of the clock signal $\phi_S$, and the sense and latch circuit constituted by the N-channel transistors Q21 and Q22 is turned ON, so as to amplify the potential difference between the bit lines BL1 and $\overline{BL1}$. In an initial stage of the amplification, there is a certain time period in which the potential at the bit lines BL1 and $\overline{BL1}$ fall slightly, but the potential difference is thereafter amplified. Accordingly, in this certain time period, the bit lines BL1 and $\overline{BL1}$ generate negative going capacitive coupling noise with respect to the cell plate and the substrate. In addition, the transistor Q31 is turned ON responsive to the falling of the clock signal $\overline{\phi_S}$, and the sense and latch circuit constituted by the P-channel transistors Q27 and Q28 is turned ON. Hence, the potential difference between the bit lines BL2 and $\overline{BL2}$ is amplified, and in an initial stage of the amplification, the bit lines BL2 and $\overline{BL2}$ generate positive going capacitive coupling noise with respect to the cell plate and the substrate.

Accordingly, by setting the characteristics of the transistors Q21 and Q22 complementarily to the characteristics of the transistors Q27 and Q28, it is possible to cancel the noise generated in the bit lines BL1 and $\overline{BL1}$ with the noise generated in the bit lines BL2 and $\overline{BL2}$.

The clock signals $\phi_{LE}$ and $\overline{\phi_{LE}}$ respectively fall and rise or vice versa at a time t2, and the restore operation is performed so as to stabilize the potentials at the bit lines to the respective high and low levels. In this case, noise in the bit lines restored in the positive going direction and noise in the bit lines restored in the negative going direction cancel each other.

Figure 8:
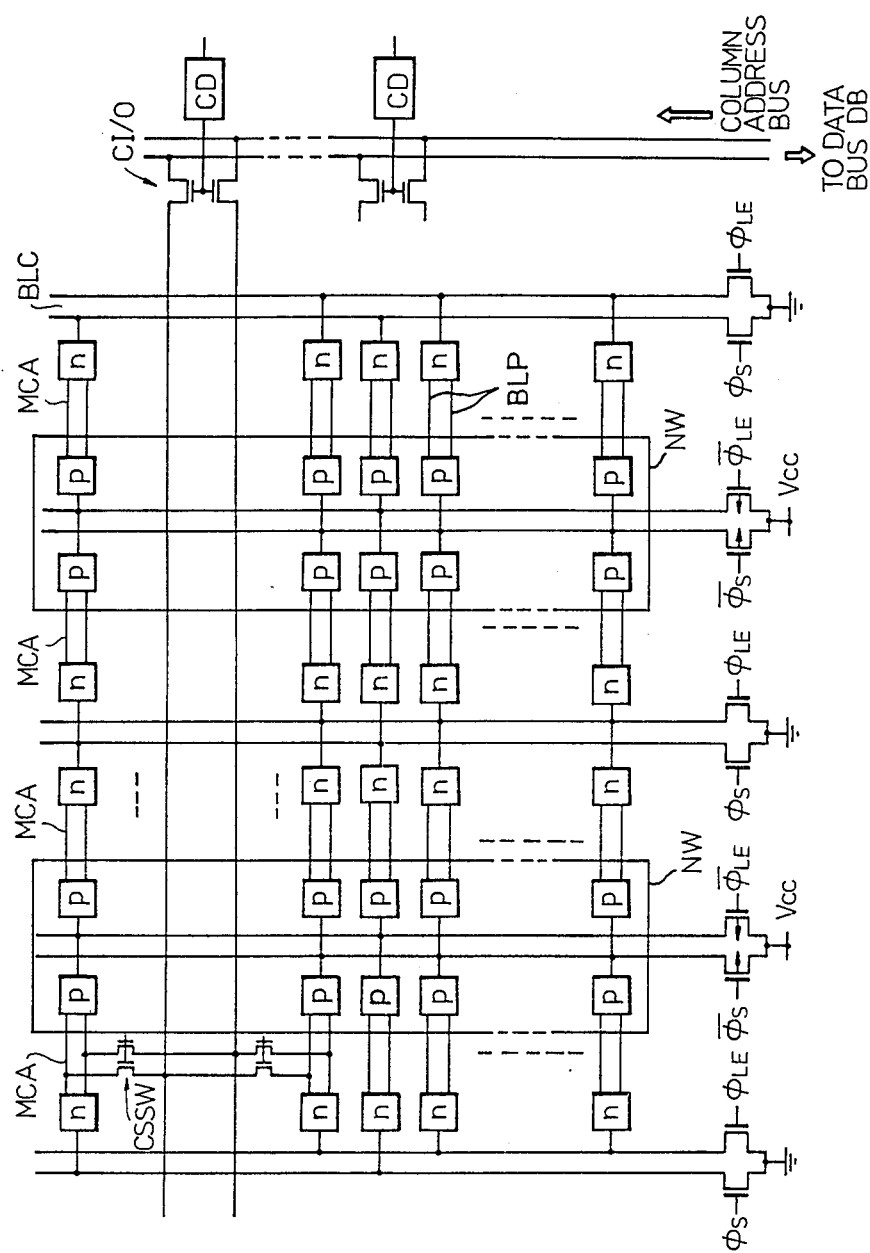
FIG. 8 is a diagram showing an embodiment of a layout of the circuit elements in the semiconductor memory device according to the present invention.

FIG. 8 shows an embodiment of the layout of the semiconductor memory device according to the present invention. In FIG. 8, n denotes a sense and latch circuit constituted by N-channel transistors, p denotes a sense and latch circuit constituted by P-channel transistors, MCA denotes a memory cell array, BLC denotes common bit lines, BLP denotes a bit line pair, CD denotes a column decoder, and NW denotes an N-type well.

In the case of the CMOS transistors, an N-channel transistor and a P-channel transistor must be separated from each other by use of a well. A region which is used for isolation at the end of the well can be reduced when the N-channel transistors and the P-channel transistors are grouped together, respectively, in order to reduce wasted area in the layout. Hence, in FIG. 8, each sense and latch circuit constituted by the N-channel transistors is coupled to one end of the pair of folded bit lines and each sense and latch circuit constituted by the P-channel transistors is coupled to the other end of the pair of folded bit lines.

The bit lines are divided into four sections so as to improve the capacity ratio. In FIG. 8, one word line (not shown) is selected for each of the four blocks of memory cell arrays MCA. Thereafter, the P-channel transistors of the sense and latch circuits and the N-channel transistors of the sense and latch circuits are turned ON by the clock signals $\phi_S$, $\overline{\phi_S}$, $\phi_{LE}$ and $\overline{\phi_{LE}}$ so as to amplify the potential difference between each bit line pair BLP. After amplifying the potential difference between each bit line pair BLP, only the data from the bit line pairs BLP within the selected block of the memory cell array are passed through column select switches CSSW and are transferred to column input/output (I/O) gates CI/O. Each column select switch CSSW comprising two transistors is provided for two columns, and the column select switch CSSW couples one of the two columns to the column I/O gate responsive to a 1-bit column select signal. The transistors of the column select switch CSSW are controlled by the column decoder CD, and the information from the selected memory cell is transferred to a data bus DB.

In FIG. 8, the four blocks of memory cell arrays MCA perform in the sensing and amplification in parallel, and thus, when the data are refreshed, it is possible to reduce the data refresh cycle by ¼. However, the power consumption will be large in this case because the charge and discharge of the bit lines are performed simultaneously in the four blocks of memory cell arrays MCA. Hence, description will now be given with respect to another embodiment of the layout of the semiconductor memory device according to the present invention in which the capacity ratio of the bit lines is improved and the problem of large power consumption is also eliminated.

Figure 9:
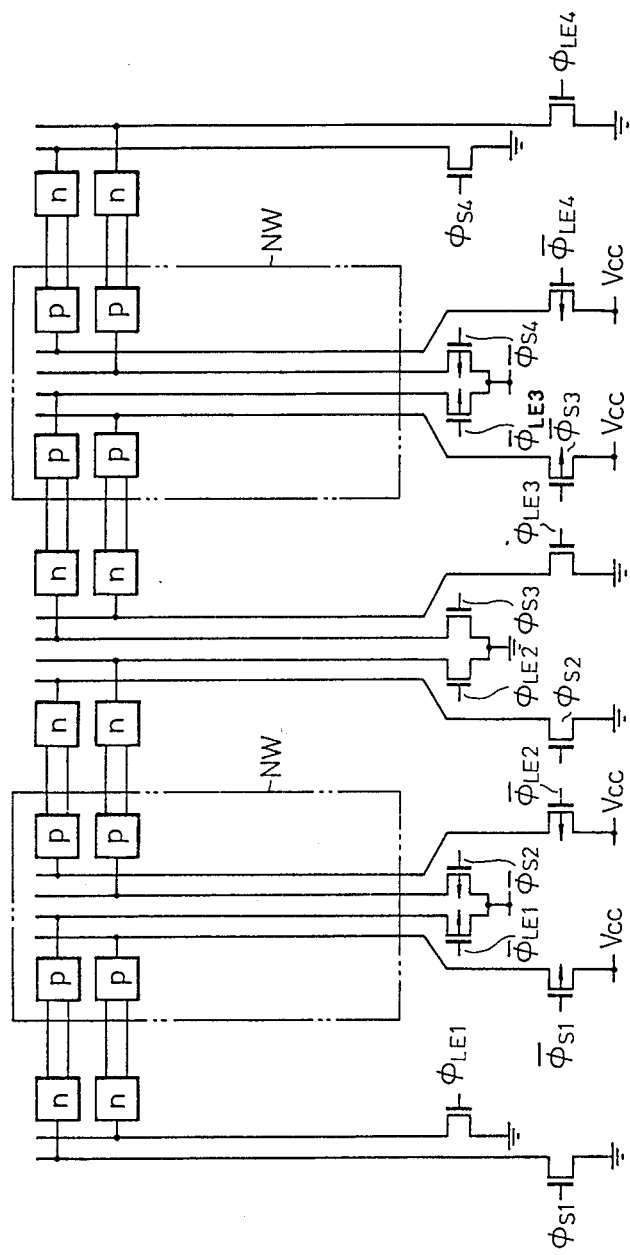
FIG. 9 is a diagram showing another embodiment of the layout of the circuit elements in the semiconductor memory device according to the present invention.

FIG. 9 shows another embodiment of the layout of the semiconductor memory device according to the present invention. In FIG. 9, the same designation is used as in FIG. 8. In FIG. 9, $\phi_{S1}$ through $\phi_{S4}$ denote clock signals for driving the sense amplifiers, $\overline{\phi_{S1}}$ through $\overline{\phi_{S4}}$ denote complementary clock signals of the clock signals $\phi_{S1}$ through $\phi_{S4}$, $\phi_{LE1}$ through $\phi_{LE4}$ denote restore clock signals, and $\phi_{S4}$, $\overline{\phi_{LE1}}$ through $\overline{\phi_{LE4}}$ denote complementary clock signals of the clock signals $\phi_{LE1}$ through $\phi_{LE4}$. The clock signals $\phi_{S1}$ through $\phi_{S4}$ are selectively supplied to the respective blocks of memory cell arrays depending on the word address, and the restore clock signals $\phi_{LE1}$ through $\phi_{LE4}$ are selectively supplied to the respective blocks of memory cell arrays depending on the word address. According to the present embodiment, only one word line (not shown) is driven at one time.

Block selecting means (not shown) can be provided so that, out of the divided bit lines, only the bit line pairs of the memory cell array in the block to which the driven word line belongs are coupled to the common bit lines. By the provision of the block selecting means, not all of the sense amplifiers will be driven at one time. In other words, only the sense amplifiers in the block to which the driven line belongs are driven, and the power consumption is reduced. In addition, it is possible to arrange the column I/O gates and the column decoders on one end of the blocks of memory cell arrays. That is, it is unnecessary to arrange the column decoders for each memory cell array, and it is possible to reduce wasted area.

In the embodiments shown in FIGS. 8 and 9, the sense and latch circuit constituted by the P-channel transistors and the sense and latch circuit constituted by the N-channel transistors are driven first for each of the bit line pairs. Hence, it is possible to effectively cancel the noise in the bit line which rises in potential with the noise in the bit line which falls in potential.

In order to make the noise cancelling effect more perfect, transfer conductances $g_m$ of the P-channel transistors and the N-channel transistors should be made the same in each sense and latch circuit so that the potential changing speed in the bit lines are the same in the rising and falling sides. In order to achieve the above, the widths of the gates of the P-channel transistors should be made greater than those of the N-channel transistors in each sense and latch circuit, so as to compensate for the differences in the characteristics caused by different carrier mobilities. Description will now be given with respect to an embodiment of the layout pattern of the device shown in FIG. 6 by referring to FIG. 10 wherein the widths of the gates of the P-channel transistors are made greater than those of the N-channel transistors in each sense and latch circuit so as to make the transfer conductances $g_m$ uniform.

Figure 10:
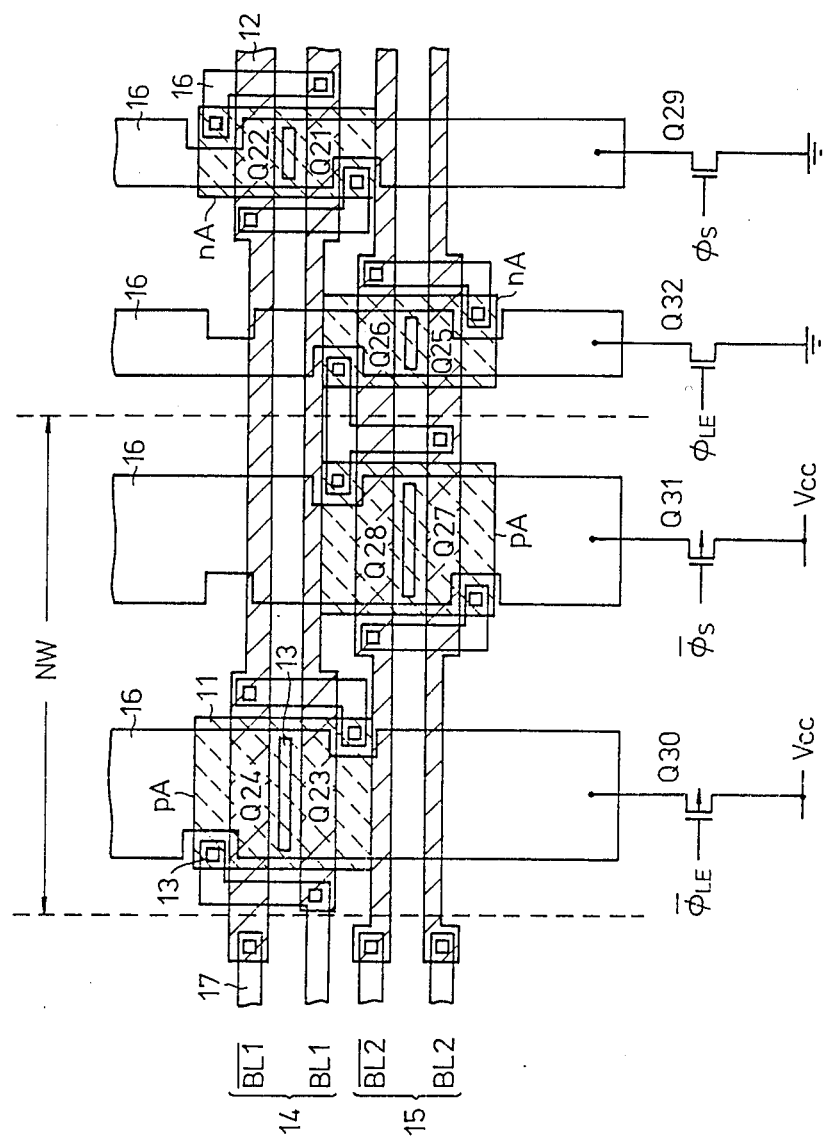
FIG. 10 is a plan view showing an embodiment of an essential part of the layout pattern of the device shown in FIG. 6.

FIG. 10 is a plan view showing an embodiment of an essential part of the layout pattern of the device shown in FIG. 6. In FIG. 10, the same designation is used as in FIGS. 6, 7A, 7B, 7C, 8 and 9. The layout pattern shown in FIG. 10 corresponds to a layout pattern in which the sense amplifier is arranged on one end of the bit line pair as shown in FIG. 6.

In FIG. 10, activating regions 11 are indicated by phantom hatchings, and gate electrodes 12 made of TiSi$_2$, for example, are indicated by solid hatchings. Contact holes 13 are formed at the locations shown. A bit line pair 14 comprises the bit lines BL1 and $\overline{BL1}$, and a bit line pair 15 comprises the bit lines BL2 and $\overline{BL2}$. For example, the bit lines are made of aluminum (Al). Common source wires 16 and wires 17 are made of Al.

In the layout pattern shown in FIG. 10, the widths of the gates of the P-channel transistors Q23, Q24, Q27 and Q28 are greater than the widths of the gates of the N-channel transistors Q21, Q22, Q25 and Q26, and the transfer conductances $g_m$ of the transistors are the same. Accordingly, the sense and latch circuit constituted by the P-channel transistors and the sense and latch circuit constituted by the N-channel transistors operate with symmetrical potential change both in the amplifying stage and the restoring stage of the operation of the sense amplifier, and a substantially perfect noise cancelling effect is obtained. In the layout pattern shown in FIG. 10 wherein the widths of the gates are different between the P-channel transistors and the N-channel transistors, there is no need to change the dimension in the direction in which the bit lines are arranged, and no problems will be introduced from the point of view of matching the pitches with which the bit lines are arranged.

In addition, the potential changing speed in the bit line is not only dependent on the gain of the transistors in each sense and latch circuit but is also dependent on the gain of the transistors Q29 through Q32. For this reason, it is desirable to make the widths of the gates of the P-channel transistors Q30 and Q31 greater than those of the N-channel transistors Q32 and Q29, so that the transfer conductances $g_m$ of these transistors also become the same.

According to the first embodiment, the noise in the bit lines are cancelled when the potential difference between the bit lines is sensed and amplified. Hence, the cell plate voltage becomes stable, and the so-called bump noise will not occur. Therefore, the cell voltage of the memory cell containing the datum "1" will not fall as in the case of the conventional semiconductor memory device, and the sensitivity of the sense amplifier is improved. Conventionally, when the memory cell array is formed within a well, it is difficult to stabilize the potential of the well. However, since the CMOS transistors are used in the first embodiment, the potentials of the cell plate and the substrate (well) are unaffected by the noise and it is possible to considerably reduce the wires which are required to stabilize the potential of the well. Hence, the first embodiment is also advantageous from the point of view of improving the integration density.

Figure 11:
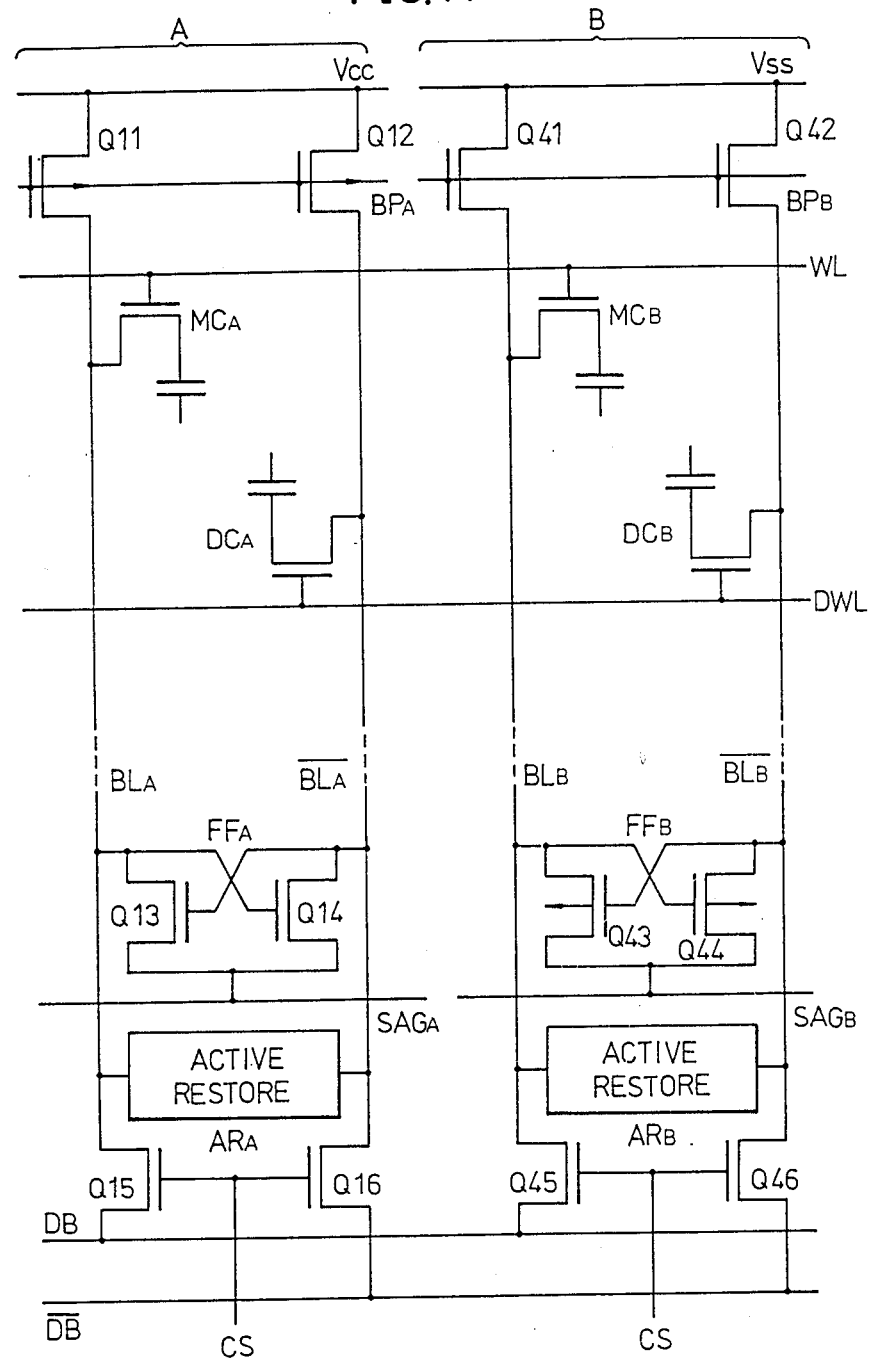
FIG. 11 is a circuit diagram showing an essential part of a second embodiment of the semiconductor memory device according to the present invention.

FIG. 11 is a circuit diagram showing an essential part of a second embodiment of the semiconductor memory device according to the present invention which employs a bit line pre-charge voltage equal to the power source voltage for a first bit line pair and employs a bit line pre-charge voltage equal to the ground voltage level for a second bit line pair. In FIG. 11, the same designation is used as in FIG. 4. Gate transistors Q41 and Q42 are provided for pre-charging bit lines BL$_B$ and $\overline{BL_B}$. Bit lines BL$_A$ and $\overline{BL_A}$ and the bit lines BL$_B$ and $\overline{BL_B}$ are folded bit lines. A signal line BP$_A$ is a bit line pre-charge line for driving the transistors Q11 and Q12, and a signal line BP$_B$ is a bit line pre-charge line for driving the transistors Q41 and Q42. Memory cells MC$_A$ and MC$_B$ are coupled to the word line WL, and dummy cells DC$_A$ and DC$_B$ are coupled to the dummy word line DWL. A sense amplifier FF$_A$ comprising the transistors Q13 and Q14 and an active restore circuit SAG$_A$ are coupled to the bit lines BL$_A$ and $\overline{BL_A}$, and a sense amplifier FF$_B$ comprising the transistors Q43 and Q44 and an active restore circuit SAG$_B$ are coupled to the bit lines BL$_B$ and $\overline{BL_B}$. Gate transistors Q45 and Q46 are used to couple the bit lines BL$_B$ and $\overline{BL_B}$ to the respective data buses DB and $\overline{DB}$. In the present embodiment, CMOS transistors are used. P-channel transistors are used for the transistors Q11 and Q12 and the transistors constituting the sense amplifier FF$_B$.

In the present embodiment, the memory cell array of the device is divided into two memory groups A and B, and the two memory groups A and B are driven with mutually opposite phases.

FIGS. 12A, 12B, 12C and 12D are time charts showing the voltage and current waveforms at essential parts of the device shown in FIG. 11, for explaining the operation of the device shown in FIG. 11. In FIGS. 12A through 12D, the same designation is used as in FIG. 11.

Description will be given with respect to the read-out operation of the device shown in FIG. 11 by referring to FIGS. 12A through 12D. It will be assumed that a datum "0" is written in the memory cell $MC_A$ and a datum "1" is written in the memory cell $MC_B$. Initially, the signal line $BP_A$ is at the low level (Vss) and the signal line $BP_B$ is at the high level (Vcc). Hence, the transistors Q11, Q12, Q41 and Q42 are ON. The bit lines $BL_A$ and $\overline{BL_A}$ are pre-charged to the power source voltage level Vcc, and the bit lines $BL_B$ and $\overline{BL_B}$ are pre-charged to the ground voltage level Vss.

Figure 12A:
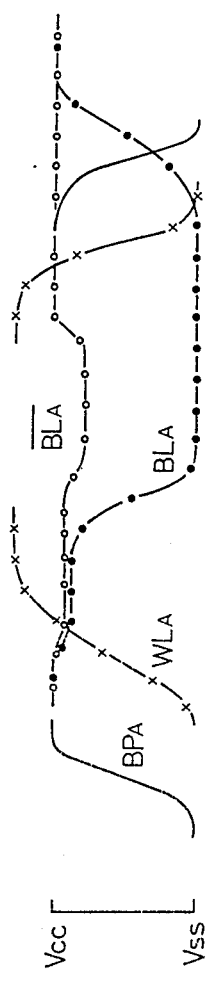
FIGS. 12A, 12B, 12C and 12D are time charts for explaining the operation of the device shown in FIG. 11.
Figure 12B:
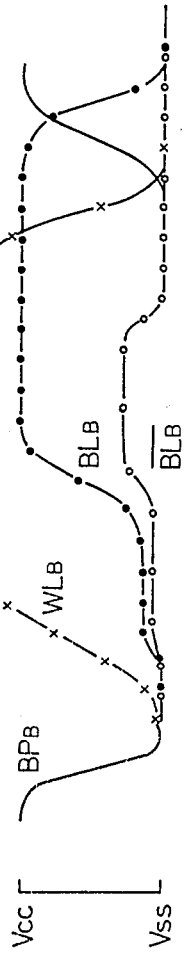
Figure 12C:
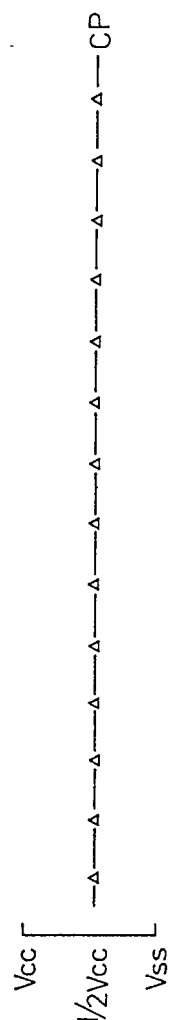

First, when the potential at the sigal line $BP_A$ rises to the high level and the potential at the signal line $BP_B$ falls to the low level, the bit lines $BL_A$ and $\overline{BL_A}$ which are pre-charged to the power source voltage level Vcc and the bit lines $BL_B$ and $\overline{BL_B}$ which are pre-charged to the ground voltage level Vss respectively assume floating states. Next, when the potential at the word line WL rises, a slight current flows from the bit line $BL_A$ to the memory cell $MC_A$ and the potential at the bit line $BL_A$ falls slightly as shown in FIG. 12A. Consequently, a potential difference is introduced between the bit lines $BL_A$ and $\overline{BL_A}$. On the other hand, a slight current flows to the bit line $BL_B$ from the memory cell $MC_B$ and the potential at the bit line $BL_B$ rises slightly as shown in FIG. 12B. Hence, a potential difference is introduced between the bit lines $BL_B$ and $\overline{BL_B}$. The potential differences are sensed and amplified in the respective sense amplifiers $FF_A$ and $FF_B$, and as a result, the potential at the bit line $BL_A$ falls to the ground voltage level Vss and the potential at the bit line $BL_B$ rises to the power source voltage level Vcc. The potentials at the bit lines $\overline{BL_A}$ and $\overline{BL_B}$ slightly fall and rise, respectively, due to the effects of the capacitive coupling. The slight fall and rise in the respective potentials at the bit lines $\overline{BL_A}$ and $\overline{BL_B}$ are compensated for by the active restore circuits $AR_A$ and $AR_B$, and the potentials at the bit lines $\overline{BL_A}$ and $\overline{BL_B}$ were again pulled up to the power source voltage level Vcc and pulled down to the ground voltage level Vss, respectively.

Such a sequence of operations completes one read-out operation, and thereafter, the potential at the word line WL is lowered and the bit lines $BL_A$, $\overline{BL_A}$ $BL_B$ and $\overline{BL_B}$ are again pre-charged to the respective voltage levels. The transistors Q11, Q12, Q41 and Q42 are turned ON by raising the potentials at the signal lines $BP_A$ and $BP_B$, and the bit line $BL_A$ which is at the low level is pre-charged to the power source voltage level Vcc while the bit line $BL_B$ which is at the high level is pre-charged to the ground voltage level Vss.

Therefore, according to the second embodiment, the memory cell array is divided into the two memory groups A and B, and the two memory groups A and B are driven with mutually opposite phases. Hence, during the read-out operation, the level change in the bit line $BL_A$ as the potential falls from the power source voltage level Vcc to the ground voltage level Vss and the level change in the bit line $BL_B$ as the potential rises from the ground voltage level Vss to the power source voltage level Vcc are opposite to each other. For this reason, even when the capacitive coupling or the like exists, the cell plate voltage CP does not change as may be seen from FIG. 12C. Similarly, the substrate bias voltage $V_{BB}$ also does not change as may be seen from FIG. 12C. Therefore, it is possible to effectively prevent the erroneous operation of the device conventionally caused by the noise.

Figure 12D:
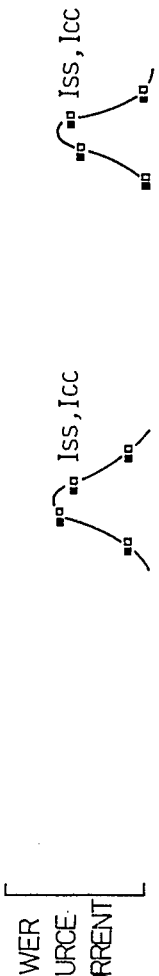

In addition, during the read-out operation, when the potential at the bit line $BL_A$ falls from the power source voltage level Vcc to the ground voltage level Vss, the potential at the bit line $BL_B$ rises from the ground voltage level Vss to the power source voltage level Vcc. Furthermore, when the potential at the bit line $BL_A$ rises from the ground voltage level Vss to the power source voltage level Vcc, the potential at the bit line $BL_B$ falls from the power source voltage level Vcc to the ground voltage level Vss. Accordingly, as shown in FIG. 12D, the current Iss flowing to the ground line and the current Icc flowing to the power source voltage supplying line are respectively reduced by approximately one half compared to the currents shown in FIG. 5C described before. Consequently, the noise is suppressed also from this point of view, and the device is even more positively prevented from performing the erroneous operation.

In the second embodiment, the memory cell array is divided into two groups, but the physical arrangement of the memory groups can be modified according to the needs. For example, a plurality of memory cells and sense amplifiers coupled to the bit line pair belonging to the memory group A and a plurality of memory cells and sense amplifiers coupled to the bit line pair belonging to the memory group B may be arranged alternately. it is also possible to repeat such a sequence of memory cells and sense amplifiers for every arbitrary number of memory groups.

According to the second embodiment, it is possible to prevent changes in the cell plate voltage and the substrate bias voltage by operating the pair of memory groups with mutually opposite phases. Moreover, it is possible to prevent a large current from flowing to the power source voltage supplying line and the ground line when the potential at the bit lines change. Therefore, the noise in the bit lines is effectively suppressed, and the reliability of the device is considerably improved compared to the conventional device.

Further, the present invention is not limited to these embodiments, but various variations and modifications may be made without departing from the scope of the present invention.

What is claimed is:

1. A semiconductor memory device comprising:
   a memory cell array constituted by at least a pair of memory groups;
   a first bit line pair coupled to a first memory group of the memory groups;
   a second bit line pair coupled to a second memory group of the memory groups;
   a first sense amplifier coupled to said first memory group for sensing and amplifying a potential difference in
   said first bit line pair, said first sense amplifier comprising P-channel transistors; and
   a second sense amplifier coupled to said second memory group for sensing and amplifying a potential difference in said second bit line pair, said second sense amplifier comprising N-channel transistors,
   said first and second sense amplifiers being driven with mutually opposite phases.

2. A semiconductor memory device as claimed in claim 1 in which said first and second bit line pairs are respectively pre-charged to a voltage in-between a high level and a low level.

3. A semiconductor memory device as claimed in claim 2 which further comprises a first active restore circuit coupled to said first bit line pair and comprising N-channel transistors, and a second active restore circuit coupled to said second bit line pair and comprising P-channel transistors, said first and second active restore circuits being driven with mutually opposite phases so that said first sense amplifier and said first active restore circuit are not driven simultaneously.

4. A semiconductor memory device as claimed in claim 3 in which said P-channel transistors constituting said first sense amplifier and said second active restore circuit have gates with widths which are greater than those of said N-channel transistors constituting said second sense amplifier and said first active restore circuit, so that transfer conductances of the transistors are the same.

5. A semiconductor memory device as claimed in claim 4 which further comprises a first driving circuit comprising a P-channel transistor for driving said first sense amplifier, a second driving circuit comprising an N-channel transistor for driving said first active restore circuit, a third driving circuit comprising an N-channel transistor for driving said second sense amplifier, and a foruth driving circuit comprising a P-channel transistor for driving said second active restore circuit, said P-channel transistors constituting said first and fourth driving circuits having gates with widths which are greater than those of said N-channel transistors constituting said second and third driving circuits, so that the transfer conductances of the transistors are the same.

6. A semiconductor memory device as claimed in claim 3 in which said first and second sense amplifiers constitute a first dynamic flip-flop circuit, and said first and second active restore circuits constitute a second dynamic flip-flop circuit.

7. A semiconductor memory device as claimed in claim 1 in which said first bit line pair is pre-charged to a power source voltage level and said second bit line pair is pre-charged to a ground voltage level.

8. A semiconductor memory device as claimed in claim 7 in which each of said first and second memory groups have a memory cell and a dummy cell as a pair.

9. A semiconductor memory device as claimed in claim 1 in which a plurality of pairs of memory groups are alternately arranged on a substrate.

10. A semiconductor memory device as claimed in claim 9 in which P-channel transistors in one memory group and P-channel transistors in another memory group are provided in a common N-type well of the substrate.

* * * * *